United States Patent [19]
van den Hamer et al.

[11] Patent Number: 5,392,220
[45] Date of Patent: Feb. 21, 1995

[54] METHOD AND SYSTEM FOR ORGANIZING DATA

[75] Inventors: Peter van den Hamer; Menno A. Treffers, both of Eindhoven, Netherlands

[73] Assignee: U.S. Philips Corporation, New York, N.Y.

[21] Appl. No.: 232,856

[22] Filed: Apr. 25, 1994

Related U.S. Application Data

[63] Continuation of Ser. No. 151,587, Nov. 12, 1993, abandoned, which is a continuation of Ser. No. 683,394, Apr. 10, 1991, abandoned.

[30] Foreign Application Priority Data

Apr. 13, 1990 [EP] European Pat. Off. ............ 90200919

[51] Int. Cl.$^6$ .............................................. G06F 15/40
[52] U.S. Cl. ...................................... 364/488; 395/600
[58] Field of Search ........................... 364/488–491, 364/192, 468, 474.22, 474.24; 395/500, 600, 650

[56] References Cited

U.S. PATENT DOCUMENTS

| | | | |
|---|---|---|---|
| 4,663,704 | 5/1987 | Jones et al. | 364/191 |
| 4,835,730 | 5/1989 | Shimano et al. | 364/191 |
| 5,005,119 | 4/1991 | Dumbaugh et al. | 364/191 |
| 5,150,308 | 9/1992 | Hooper et al. | 364/489 |

OTHER PUBLICATIONS

"IDEAS—An Integrated Design Automation System", Z. Mehmood et al., Proceedings of the 1987 IEEE International Conference on Computer Design: VLSI in Computers and Processors, Oct. 5–8, 1987, pp. 407–412.

*Primary Examiner*—Vincent N. Trans
*Attorney, Agent, or Firm*—David Schreiber

[57] ABSTRACT

The invention describes the organizing and accessing of data pertaining to an engineering process. The process is partitioned into subprocess which are linked in a directed-acyclic-graph. Each link has a source node and a destination node, indicating which source node(s) must have been executed to provide the data necessary for executing the destination nodes. Executing any subprocess provides an instance of data associated to that node. The latter instances are linked in a second directed-acyclic-graph wherein each link indicates that part or all of the data at the source node has effectively been used for generating the data at its destination node. The two graphs are interlinked and provide for easy browsing of the data as well as for easy selection of input data for engineering subprocesses.

11 Claims, 3 Drawing Sheets

METHOD AND SYSTEM FOR ORGANIZING DATA

This is a continuation of application Ser. No. 08/151,587, filed Nov. 12, 1993, which is a continuation of Ser. No. 07/683,394, filed Apr. 10, 1991, both now abandoned.

FIELD OF THE INVENTION

The invention relates to a method for organizing and accessing product describing data pertaining to an engineering process, in particular, but not exclusively for use in an electronic engineering environment, such as computer aided design of an integrated circuit and its associated data files. In the above, pertaining means generated by the process and used outside the process, or generated outside the process and used by the process, or both generated and used by the process. Similar considerations apply on the subprocess level. Such an electronic or other engineering process requires a sequence of operation steps, of which a typical example could be a silicon compiler system such as described in U.S. patent application Ser. No. 156,392, filed Feb. 16, 1988, herein incorporated by reference, now U.S. Pat. 5,005,131, and corresponding to EP application 89200310.4, (PHQ 88.005) assigned to the same assignee. Successive steps in silicon compilation may be:

A. receiving a source text expressing an algorithm in an imperative concurrent computer language;

B. converting this text to a structure tree as an abstract representation of the source text;

C. converting the structure tree to an abstract circuit representation featuring abstract channels;

D. converting the abstract circuit to a concrete circuit representation being constituted of gate level elements and wires;

E. next, generating a so-called net-list, which specifies all electronic elements and their interconnections;

F. from the net-list, generating a lay-out;

G. from the lay-out so generated, executing a simulated test operation.

With increasing levels of complexity and sophistication, the amounts of data, the number of data files, the complexity of their relations and, in consequence, problems relating with managing such data, grow exponentially, caused inter alia by the design being characterizeable as a trial and error process. Systems for organizing and managing the body of information with the intent of supporting the engineers involved may be called frameworks. Access must be easy and secure. This may be effected by placing the various data files or units under control of the system which itself possesses control information or design management data relating to the structure and usage of the data files or units. In a refined version, the system could use this control information to organize the data, to provide access to the data and to check requested operations on the data against integrity/security rules. The system also could provide support for certain project management aspects of the engineering process by providing an overview of the available data and their status. At present no adequate solution to the problems sketched has been available.

Important aspects to be dealt with may include:
what units of data belong together?
what do the data represent?
which version of the data is this?
how was this data created?
where is this data used?

SUMMARY OF THE INVENTION

Among other things, it is an object of the invention to provide a method for organizing and accessing product describing data pertaining to an engineering process, by devising a flexible and powerful set of concepts with which to describe the structure of various sets of engineering data upon their generation and use. Now, concepts used to model the structure of the engineering data include "versioning", "equivalence" and "alternatives", which in our method and system are basically handled using the derivation graph, to be discussed hereinafter. Versioning is a well-known concept in hardware and software for discerning between successive solutions. Equivalence puts various solutions on an equal footing. Alternatives are solutions basing on a particular choice made. Now, the present invention is most suitable/useful under the following conditions:

1) the data being managed is subject to numerous changes and/or updates such as is typical in trial and error engineering. The technique may be more suitable for work-in-progress data than for libraries, standards, archives or other bodies of consolidated data.

2) the engineering process consists of a significant number of different steps which can each be redone independently of following steps: although previous steps must have rendered their results available, the process need not run to the end. A prime example of this is electrical engineering (VLSI, ASIC, discrete components).

According to one of its aspects, the invention provides a method for organizing and accessing product describing data, generated and/or used by an engineering process comprising multiple engineering subprocesses, said method comprising:

a. providing a first set of flow nodes, each individual flow node representing one unique of said subprocesses;

b. performing at least one flow node execution, which flow node execution represents a corresponding subprocess execution which thereby uses and/or generates respective part(s) of said product describing data;

c. providing a data flow model of the engineering process by linking said flow nodes to form a first directed-acyclic-graph of which each flow link, by connecting one source flow node to one destination flow node, represents as fact that each execution of said destination flow node requires partial or complete usage of product describing data generated by execution of said source flow node;

d. providing a second set of data nodes, each individual data node referencing one unique flow node for so representing one unique individual execution of the flow node so referenced and consequently also representing the product describing data generated by the latter unique individual execution;

e. providing a model of the product describing data used and/or generated by the engineering process by linking said data nodes to form a second directed-acyclic-graph of which each data link by connecting one source data node to one destination data node, represents as fact partial or complete usage of the product describing data represented by said source data node for generating the product describing data represented by said destination data node;

f. providing a mechanism for selecting from the second set of data nodes a first subset of data nodes by selecting one first particular flow node which restricts said first subset of data nodes to those data nodes which reference said first particular flow node;

g. selecting an arbitrary number of auxiliary subsets of data nodes, each auxiliary subset referencing one respective further particular flow node, that is directly or indirectly linked as source flow node to said first particular flow nodes by respective associated flow link or links in said first directed acyclic graph, for so providing a mechanism for reducing said first subset of data nodes to form a final set of data nodes in that from said first subset of data nodes said final subset of data nodes comprises only those data nodes for which the engineering subprocess execution represented thereby directly or indirectly had used the product describing data represented by one of the data nodes in each respective individual auxiliary;

h. accessing the product describing data represented by said final subset of data nodes using mapping information relating individual data nodes to product describing data residing within a data storage system. So, the method boils down to mapping the subprocesses one-to-one on the flow nodes, linking the flow nodes according to a data-to-data paternity pattern in a first graph, tethering to each flow node the data generated by its execution, linking also the data nodes according to a data-to-data paternity pattern, and accessing the data structure along lines of paternity linkage and/or tethering. In particular, the direction of accessing is now following the links in a downstream direction. This would answer questions like: where is this data used? or which is the consequence of this particular phenomenon encountered? Generally, this procedure would uncover data that were generated by a particular execution.

FURTHER ASPECTS TO THE INVENTION

Advantageously, a second selection mechanism is provided which involves travelling uniformly along links of said first directed-acyclic-graph in a direction from the destination nodes to the source nodes of the latter links. In particular, the direction of traversal is now following the links in an upstream direction. This would answer questions like: how is this data created? or what is the cause of this particular phenomenon encountered? Generally, this procedure would uncover data that were used by a particular execution. Both upstream travelling and downstream travelling represent attractive accessing strategies.

Advantageously, each particular data link is coupled to exactly one flow link in that the product describing data represented by either end node of said data link originate from an execution of the processes corresponding to the respective end nodes of the thereto coupled flow link.
Such secondary mapping forces to relevant linking in the data graph. It can also represent a means for additionally checking upon each modification in the database. In particular cases, however, other realizations are feasible.

Advantageously, the first directed-acyclic-graph is extended to an extended directed-acyclic-graph with information about the way in which the product describing data, produced and used, respectively, by executions of the engineering subprocesses is physically partitioned into units and wherein the second directed-acyclic-graph is extended with information mapping said individual units of data residing within a storage system onto elements of the second directed-acyclic-graph.

In this way, the system is able to control the flow of information between programs at the level of individual units. Note that in most cases this additional level of detail can be kept transparent for the end-user. By itself, the grouping of data files to data sets, and, conversely, the distribution of data sets over data files is a conventional database management concept, which in this case would facilitate the accessing.

Advantageously, the flow nodes within the extended directed-acyclic-graph are provided with additional typing information representing the type of engineering subprocess of which they are an instance thereby allowing the usage of the flow nodes in the extended directed-acyclic-graph to be checked against said typing information. Such provision in the lowest level of the three levels (the engineering subprocess typing level) allows for additional integrity checking of the data structure.

Advantageously, a further subset of the flow nodes of the first directed-acyclic-graph is provided with information pertaining to a physical location and method of invocation of executable programs corresponding to the respective elements of said further subset, thereby allowing the information in the first directed-acyclic-graph to be used to automate and/or support the execution of said executable programs. In this way, the program-related information occurring in the flow nodes can be used to partially or fully automate the invocation of the programs in question. This can, for example, be used to implement additional functionality which is roughly comparable to that of the MAKE facility as commonly used in UNIX software development environments. The latter have become in extensive use.

Advantageously, an additional type of link is introduced interconnecting flow nodes in the first directed-acyclic-graph thereby representing non-mandatory use of product describing data by executions of the engineering subprocess corresponding to the destination node of said type of links.
This feature is particular useful in editing tools. Alternatively certain types of iteration may benefit. In particular, an optional loop may be created in this way. In the particular case of an editor, the output data thereof may be used as new input data, after original execution of the editor without provision of input data in first instance.

Advantageously, the first directed-acyclic-graph forms a hierarchical model of the engineering process by linking nodes therein representing either individual engineering subprocesses or subgraphs of interlinked engineering subprocesses. Such useful feature of the present invention allows engineering subprocesses to be described in terms of lower level engineering subprocesses. Such a description may be called a nested flow description. Flow nesting can be used to hide lower level subprocesses from the user. For example, the sequence of lower level subprocesses consisting of a pre-processor step, a tool execution and a post-processor step can be represented as a single higher level subprocess in which the pre- and post-processing steps are hidden.

Another direct application of flow nesting involves assigning users, or groups of users, to one or more subprocesses in the hierarchy of subprocesses. This information can be used to restrict the accessibility and visibility of product describing data generated by the execution of any particular lower level engineering subprocesses to those users who have been assigned to the engineering subprocess containing said particular lower level engineering-subprocess.

The latter application of flow nesting is a new approach to providing functionality which is similar to that of the so-called workspace concept while avoiding some of the implementation and usage complexity associated with the workspace concept.

As in the foregoing, executing any subprocess or lower level subprocess may again produce product describing data which is mapped on a particular data node in the second directed-acyclic-graph. Depending on the level of microscopism required, the level of subprocesses is aggregated or kept disjunct, as the situation requires.

Advantageously, such hierarchical description of the engineering process limits the accessibility and visibility of product describing data generated by the execution of flow nodes belonging to a particular level of the hierarchy to those users of the system with appropriate privileges for said particular level. Such accessibility, visibility, etcetera may represent status of the data, provide protected data access and in other aspects support or provide project management. Thus, the overall engineering process may be accessible to a general category of users, a next lower level may be accessible to users involved specifically in the associated subprocess(es), and so on. The latter users may be maintenance officers, whereas the former only operate to design circuitry using the direct results. Many other distinction levels are feasible.

The invention, moreover, relates to a data management system comprising a physical implementation of a method as described, comprising storage means for storing product describing data represented data by said nodes, graphs, instances and links, input means for inputting further product describing data and user requests and output means for under control of a user request selectively outputting and/or displaying subsets of product describing data stored in said storage means. Such system is readily implementable on a medium scale computer, such as a Digital Equipment Corporation VAX-computer or the like. Alternative vehicles may be Apollo-type workstations now being manufactured by a subsidiary of Hewlett-Packard Corporation and linked in a computer network.

In particular, advantageously the product describing data may be electronic engineering data as explained earlier. Alternatively, the product may be a mechanical engineering product, a software engineering product, or the engineering product may itself be an engineering process.

Advantageously, in a method as described supra, one or more feedback links are added to said first directed-acyclic-graph, thereby transforming said first directed-acyclic-graph into a generalized directed graph exhibiting cycles, whereby each feedback link, having exactly one source flow node and exactly one destination flow node, represents the fact that the product describing data generated by an execution of said flow node can optionally be used as input for the execution of said destination flow node, thereby providing the capability of modifying the latter product describing data an arbitrary number of times. This allows for a powerful iteration feature.

BRIEF DESCRIPTION OF THE DRAWING

The invention will be explained hereinafter by way of disclosing a non-limitative preferred embodiment such as disclosed in and by the appended Figures wherein.

DESCRIPTION OF A PREFERRED EMBODIMENT

Figure 1:
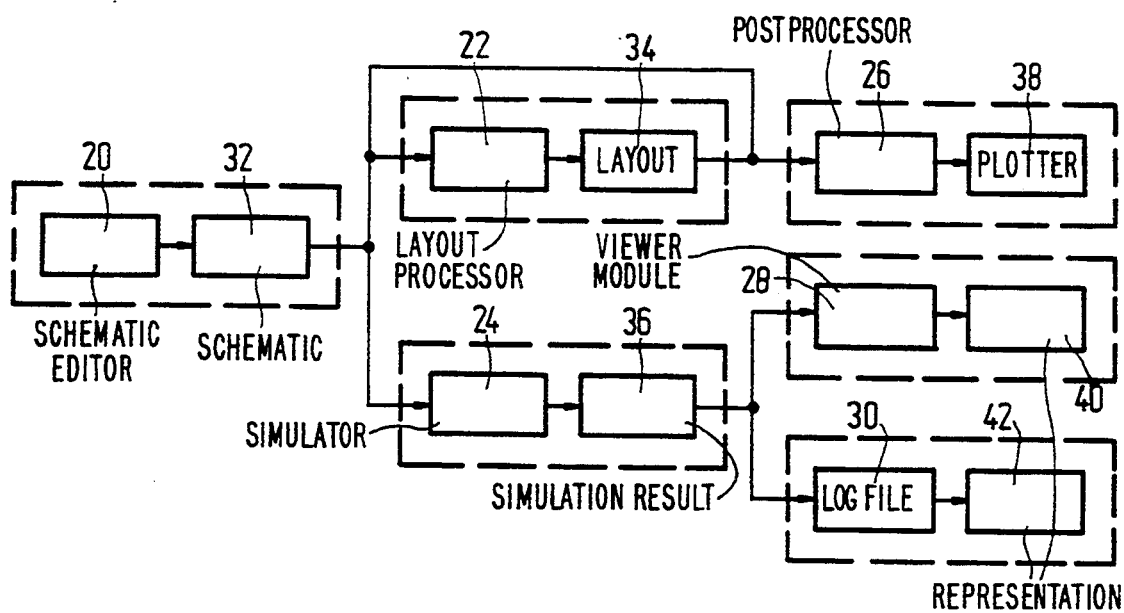
FIG. 1 is a sample flow map showing tools and data useage.

FIG. 1 is a sample flow map showing tools and data useage. Data flows from left to right in this notation. In this example, blocks 20, 22 . . . 30 represent tools. Examples of such tool functions have been given under A-G, supra, for a silicon compiler. In other engineering systems, corresponding subprocesses would be obvious to the person of average skill. Generally, the tool itself is a computer program for effecting such tool function. Each run of a tool may generate an instance of the representation type following the tool in question in the Figure. Each tool may generate many kinds and versions of the same representation type, for example, in that eliminating a bug or problem at a particular level would lead to corresponding different instances at each next following level in the lineage. Any instance, if applicable, may be of one alternative type of a set of types, for example, either before or after the problem has been removed. Moreover, any tool itself may yield instances that have different character, for example in that the partial results are classified into disjunct representations or results. Now, blocks 32 . . . 42 represent such instances. Thus, running of tool 20 generates representations of the type symbolized by block 32. Running of tool 28 generates representations of the type symbolized by block 40. For simplicity, each running or execution of the same tool is presumed to generate only a single category of representation. Alternatively, such blocks 32 . . . 42 are presumed to contain all representations produced by the flow caused by running its associated tool. Examples are that a particular tool used in CAD of VLSI-circuitry may produce either a schematic or a net-list or both each time the tool is executed. A schematic is a two-dimensional drawing showing subsystems as blocks plus their interconnections in the form of lines. A net-list gives, starting from a first subsystem interconnection pin all other pins (on the same or on another sub-system) to which the former pin is connected.

Another example would be that a simulator tool produces both an output waveform and an ASCII-coded character log file. Which one of the latter two be needed, is entirely determined by the selected viewing tool so that the details of the system are transparent to a user. Hereinafter, the combination of a tool block and its next-following output representational block is made into a node of a derivational first directed-acyclic-graph (flow-graph). A set of output representations produced by a single tool run is regarded hereinafter as a single entity, regardless of their accidental representations. Physically, such multiple representations may thereafter be distributed among multiple files, each pertaining to an associated respective node. It should be noted that the distinction between different representations is determined by convention and technology, rather than by essence or principle. Likewise, FIG. 1 may be changed in that the various data representations of running a particular tool be each assigned a given box, e.g. in that box 36 had been divided into box 36A, leading exclusively to tool box 28, and another box 36B leading exclusively to tool box 30 (assuming that each of the latter tools need only a single data representation, which would be unique and mutually exclusive between tool boxes 28, 30). It should be noted that FIG. 1 should show all items and links with respect to the tools shown. Thus, tool 20 only outputs to block 32. Tool 24 exclusively feeds on data from that in block 32 and exclusively outputs to block 36. Now, FIG. 1 mathematically is a tree. Alternatively, the graph could have two source nodes linking to a single destination node. Instead of source node 24/36 linking by respective links to destination nodes 28/40, 30/42, in another circumstance both nodes 22/34 and 24/36 could as source nodes be linked to destination node 28/40. In this way a generalized directed-acyclic-graph would be procuded. In a database representation the linking could be by tethering pointers in the data pertaining to a particular flow node. The pointer may be an address, a logical name, or some other entity, and would distinguish between a source flow node and a destination flow node in an elementary way.

Figure 2:
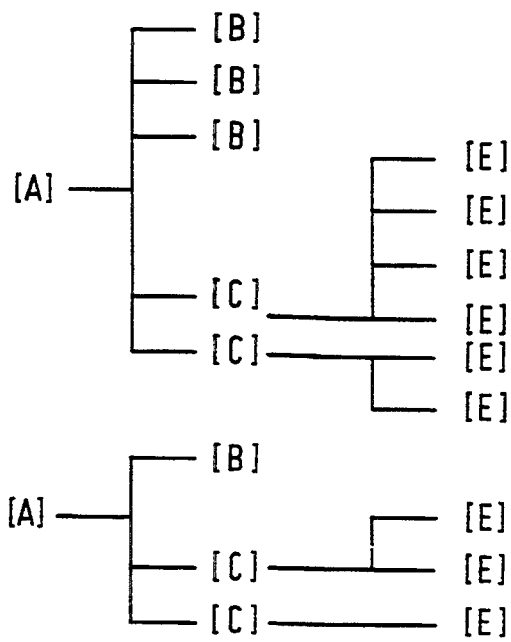
FIG. 2 is a sample derivation graph for the flow graph of FIG. 1.

FIG. 2 shows a sample data derivation graph which might occur, given the flow graph of FIG. 1. No tools are shown. Each letter in FIG. 2 represents an instance of an associated representation in FIG. 1. Thus, there are two instances A of representation 32, four instances B of representation 34, four instances C of representation 36, and nine instances of representation 40. Tools 26, 30 were not used. In the data structure of FIG. 2, each derived instance must remember its father instance. Additionally, each father instance (C) may remember every son instance (E) referring to that father. In particular applications, especially in electronic engineering, each link between a particular father instance and a particular son instance may remember the options of the tool and the particular circumstances of the particular execution of that tool which created the associated instance of the representation in question. Thus, also FIG. 2 shows a directed acyclic graph.

On a specific technical level, the tools and data generated thereby may be as follows for a VLSI CAD environment:

20: schematic editor, produces schematic 32
22: lay-out processor which produces lay-out 34
24: simulator module produces simulation result 36
26: postprocessor produces one or more tapes that could be fed into a plotter or the like (38)
28: viewer module
30: read log file which may contain error messages of errors incurred in simulation, or other data.

By way of simplification, the graph of FIG. 2, like the one of FIG. 1, is a tree, which, in a similar way could be a more generalized directed-acyclic-graph. Furthermore, it could as an alternative to an electronic engineering process, relate to a mechanical engineering process, a software engineering process, or the development of a process itself, the latter process then being useable for manufacturing, or for developing one of the earlier described products of electrical, mechanical or software engineering. In a mechanical engineering process, successive analysis steps could relate to kinematic analysis, structural analysis, and styling. In software engineering, a hierarchy of programs, program modules, and routines may be detailed in successive steps. in designing a process, input commodities, intermediate buffering and critical time paths may be detailed in successive steps. The present invention in each of these cases would provide easy accessing and organizing of the product describing data.

Figure 3:
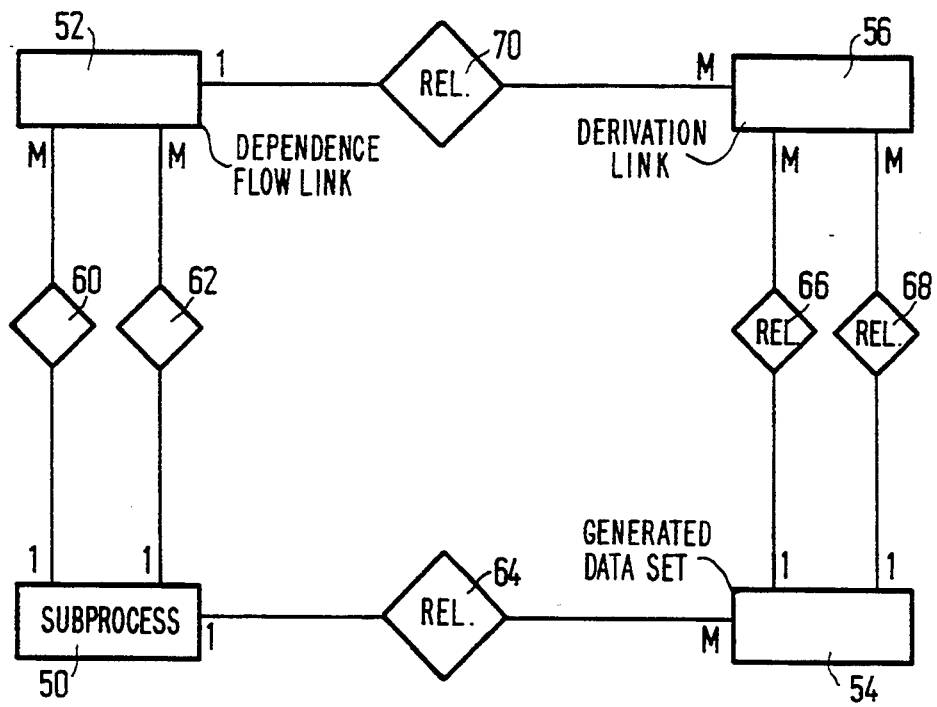
FIG. 3 is an entity/relationship diagram of an elementary database structure.

FIG. 3 shows the logical structure of the data used by a preferred elementary embodiment of the present invention. As is common practice in describing database designs, the data structure is described at the entity type level (rather than entity instance level) and at the relationship type level. Thus, any single symbol, such as a box or a diamond, explained hereinafter, can correspond to an arbitrary number 1, 2 . . . of database instances of that particular type.

The described logical data structure can be converted into a physical data structure (records, tables, attributes, pointers, etcetera) and augmented with means for reading, writing, updating, managing, and displaying the data in completely conventional ways.

It should be noted that in a typical implementation of this or any other embodiment of the invention, these structures will be supplemented with additional structures dealing with the various functional extensions without departing from the present inventive concept. Such additional structures may be, for example, (parts of) hierarchies used in describing the design data or information, characterizing the allowed or selected invocation options for individual flow nodes. Form the logical data organization shown, the physical organization, such as logical/physical addressing, labeling, referencing between records, displaying, inputting, outputting and various other physical-directed operations may be effected in completely conventional way. Of course, the structures shown are only minute examples of databases that may exhibit extreme degrees of complexity and massive storage requirements without departing from the present inventive concept. In particular, FIG. 3 shows an entity/relationship diagram defining the structure of an elementary database for storing both the flow map information and the administrative data about the product describing data being managed as required by the method of this invention. The boxes represent entity types, the diamonds represent relationship types between the connected entity types and the labels "1" and "M"="many" along the connections between diamonds and boxes provide cardinality information about the associated relationship types. For more information on database schemas in general and the Entity/Relationship notation in particular, see "An Introduction to Database Systems", Volume 1, C. J. Date, Addison-Wesley, 1986 (4th edition).

Block 50 represents engineering subprocesses which require and/or produce product describing data. As explained, only a single box is shown, which can represent multiple instances. These subprocesses are linked among each other by dependence flow links (52), thereby forming a data flow graph of the engineering process. Each dependence flow link (52) is associated via relationships 60 and 62 with two different instances of the engineering subprocess (50) entity type, thereby respectively representing the source and destination of the flow link. Together, elements 50, 52, 60 and 62 form a directed-acyclic-graph representing data flow between the various engineering subprocesses. Again for simplicity, only two relationships 60, 62 have been shown, in that a subprocess can either be at a source end of the flow link in question or at the destination end without any third possibility being allowed here. The cardinality M of the link attachments (M) means that there can be many identical type links per subprocess.

Block 54 represents the data set generated by each execution of a particular engineering subprocess (50). Block 54 may again represent many instances. Relationship 64 links each data set to the engineering subprocess (50) by which it was generated. The cardinality M (the different letters M can have completely different values in practice) indicates that one particular process may in principle be able to generate many data sets. The data sets 54 are linked via derivation links (56). Each derivation link (56) is associated via relationships 66 and 68 with two different instances of the data set entity type 54 which respectively represent the source and destination of the derivation link (56). Together, elements 54, 56, 66 and 68 form a directed-acyclic-graph representing the usage of existing data sets in the generation of new data sets. This graph thus provides information about both the interrelationships between the various data sets (54) and about the history of the corresponding engineering subprocesses (50).

The final relationship 70 associated each derivation link 56 with exactly one flow link 52, thereby representing how the derivation link between two data sets is associated with the flow of data between two engineering subprocesses. It is worth nothing that relationship 70 serves to facilitate the maintainability of the database and can be omitted if the database integrity is maintained by suitable algorithms whenever the database is updated.

The information linking each data set entity (54) to the corresponding product describing data in a data storage system are not shown because this information depends on the physical and organizational details of the storage system and because this link can be implemented by any competent person familiar with database technology. Typically this would involve recording the network nodes, disks, directories, file names, etcetera of the product describing data for all data sets.

Figure 4:
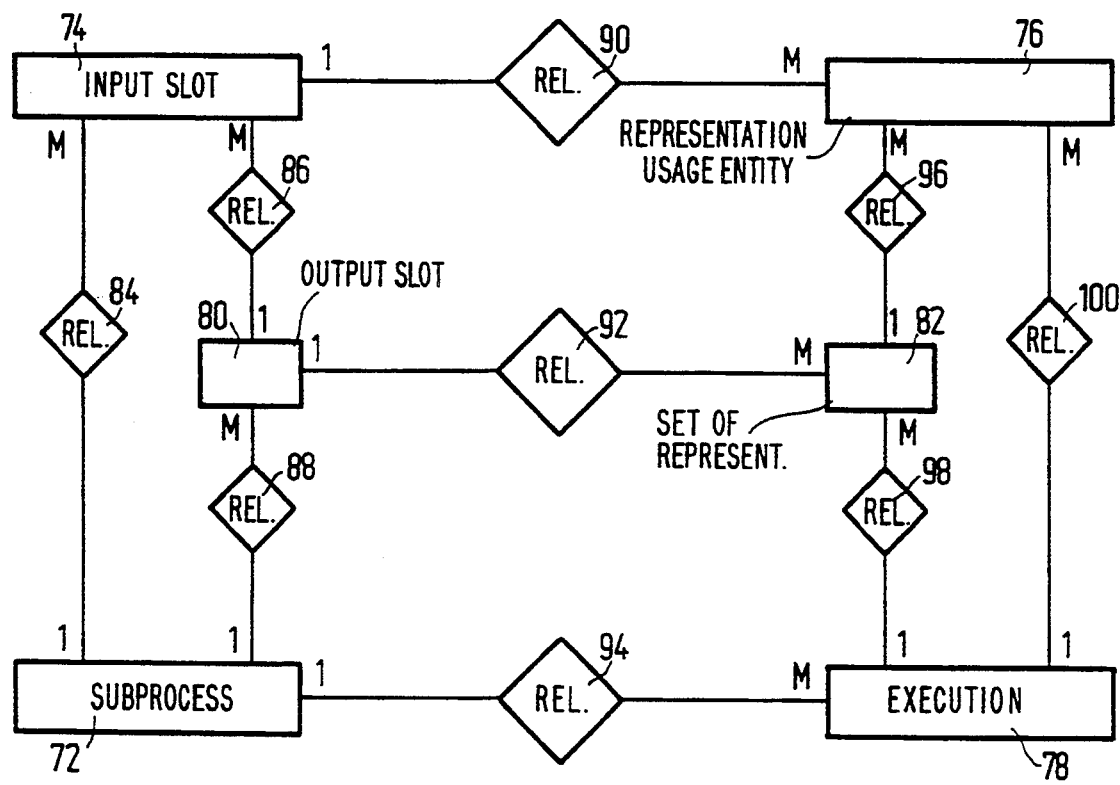
FIG. 4 is a similar diagram of a more extensive database structure.

FIG. 4 shows an entity/relationship diagram defining the structure of a more extensive database for storing the flow map information and the administrative data about the product describing data being managed. Compared to the previous Figure, FIG. 4 contains additional information about how the product describing data is partitioned into representations (e.g. "netlist", "schematic", "log file") in an electronic engineering environment. Although the basis structure of FIG. 4 is comparable to FIG. 3 and as such would require little explanation, various additions and refinements produce improved facilities and properties.

Block 72 represents engineering subprocesses which each require a set of input representations in order to produce a set of output representations. Representations are fed into a subprocess via input slots (74). Representations generated by the execution of a subprocess become available at output slots (80). Relationship types 84 and 88 respectively link each input and output slot to the corresponding engineering subprocess (72). Relationship type 86 indicates which input slots (74) are connected to which output slot (80). Together, elements 72, 74, 80, 84, 86 and 88 form a data flow model indicating how the various engineering subprocesses make use of the representations generated by other engineering subprocesses.

Block 78 represents an execution of the engineering subprocess (72) to which it is linked via relationship type 94. Each execution (78) of an engineering subprocess generates an number of representations (82) to which it is linked via relationship type 98. Each of these representations is associated with the output slot (80) by means of which it was produced via relationship type 92. Each execution (78) of an engineering subprocess (72) uses the set of representations (82) to which it is indirectly linked via relationship 100, the representation usage entity 76 and relationship 96. From the inverse point of view, each representation 82 is used by the set of engineering subprocess executions (78) to which it is indirectly linked via relationship 96, the representation usage entity (76) and relationship 100. Each representation usage entity (76), representing the usage a given representation (82) within a particular engineering subprocess execution (78), is associated with the input slot (74) in which it was used via relationship 90. Together, elements 76, 78, 82, 96, 98 and 100 describe how the representations being managed by the system are interrelated through derivation as well as their generation history.

As in FIG. 3, the information linking each representation (82) to the corresponding product describing information in a data storage system is not shown because this information depends on the details of the storage system and because this link can be implemented by any competent person familiar with database technology.

In addition to the above, tools may occur in quite simple form, in that they require one upstream tool to have been executed and thereupon allow one downstream tool to be excecuted. A more complicated tool may have two inputs and one output. Such tools may be serialized in that the output of the first operates as one of the two inputs of the second. Collectively, they would then function as a three-input, two-output composite tool. On the other hand, the output of a preceding tool may be used in two succeeding tools in parallel. The latter could have their outputs, in turn, feed only one single output tool. The combination of the four last-mentioned tools could, alternatively be represented as a single-input-single-output (compound) tool.

BACKGROUND CONSIDERATIONS

The method provides a model of the data flow between the various engineering activities needed to produce and validate the data. This model is used to store and retrieve the generated data: the data is stored according to a new data schema (logical data structure) and retrieved using a new browsing/access technique. An extension of the invention involves using the data flow information to determine the user's privileges (e.g. visibility, usage and update rights) with respect to the data being managed.

The new insight on which the invention is based can be clarified by dividing the control information which the system needs into three distinct levels:

1) "Flow-type definition level"

This part of the data schema describes which programs/subprocess steps are available when setting up one or more engineering processes. In practice this level should know which programs are available, how many "inputs" and "outputs" each program/step has (optionally with typing information). Example: a format conversion program accepts one input file and uses this to produce one output file of a different type. In FIGS. 3, 4, for reasons of clarity this level has not been visualized.

2) "Flow-map definition level"

This part of the data schema describes how the various flow-types (defined in level 1) are interconnected, thereby forming a map of a particular engineering process. The typing information of level 1 can be used to check the interconnections of level 2. This level corresponds to the left-hand halves of FIGS. 3, 4.

3) "Data and flow run level"

This part of the data schema describes individual runs (executions) of flows (as defined in level 2) along with the data these produced. Thus level 3 is basically a database about the units of data produced by the engineering process while simultaneously acting as a record of all major activities with this process. The flow-map information of level 2 can be used as a very rigorous form of type checking: it can be used to prevent the running of tools on inappropriate data units. This level corresponds to the right-hand halves of FIGS. 3, 4.

Notably, levels 1 and 2 of the resulting database are respectively filled when the system is configured while level 3 stores data about what is happening during the design process being supported.

Our invention is different from existing solutions in the way it uses a data flow model of the data generating process as the primary source of information about the nature of the data generated by the process itself. Overall advantages of this general principle and our particular technique are with respect to coherence:

The system provides close integration between functionality regarding the automation and control of the engineering process on the one hand and the functionality regarding the management of the generated data on the other hand.

Furthermore, from a pragmatic point of view:

* less effort needed to configure a system,

* less data need to be supplied about what the individual units of data represent,

* user interface can present data to users in a way consistent with the activities which are relevant at that time.

Example: the code needed to integrate an individual tool into the system can be limited to what is required to handle idiosyncracies of the tool. issues common to all tools are handled by "filling tables" describing the tool and its links to its environment.

- Accuracy:

The system uses a more accurate model of the significance c.q. structure of the data being managed than existing systems. From a pragmatic point of view the concepts with which the system communicates to the user are more powerful and close to the way the user views the data (human factors issue). The accuracy allows the system to provide more functionality, because the system knowns more about what the data being managed "means" to the user.

Example: existing systems use the concept of "versioning" for different situations which should actually be also differently. In effect, the present method and system provides the facility for such differentiation.

- Flexibility: The system can handle a wider variety of engineering processes than existing systems.

Example: the access/browsing technique works equally well on data describing the product itself as on auxiliary data, e.g. test data.

- Simplicity: The system uses fewer internal concepts than an existing system which extend to provide comparable functionality. This tends to reduce development and maintenance costs for the system and potentially reduces the training effort for end-users. The system should be slightly faster for similar reasons.

Example: unlike previous systems, the technique does not need to maintain separate sets of information for describing the classification of the data and for describing the history of the engineering process. These are handled by the same set of concepts.

It is possible that output of an engineering subprocess is used as an input of the same subprocess. Such a subprocess may be called an editor. An example is a simple text editor, in which the text, produced in a previous edit-session, can be used in a new edit-session to produce a modified version of the original text. Likewise, various other types of data editors may be used.

Generally, the data flow map of the engineering process forms a directed graph without loops. However, if the engineering process contains an editor the directed graph contains a loop. This loop requires special treatment to make it possible to execute an editor without input, in order to produce the first version of the output, thereby making the data flow in the loop optimal.

Various other useful features are: the invention allows the nesting of flows. Although this might appear a trivial issue, it allows for the construction of improved user interfaces. For example, in a preprocessor -tool- postprocessor sequence, the tool becomes hidden by the automation. Particular advantages of the use of the invention are that project organization is facilitated, person-to-person communication is done by making the data communicated visible, and also project management on a time/data/resource/manpower level is made easier.

Figure 5:
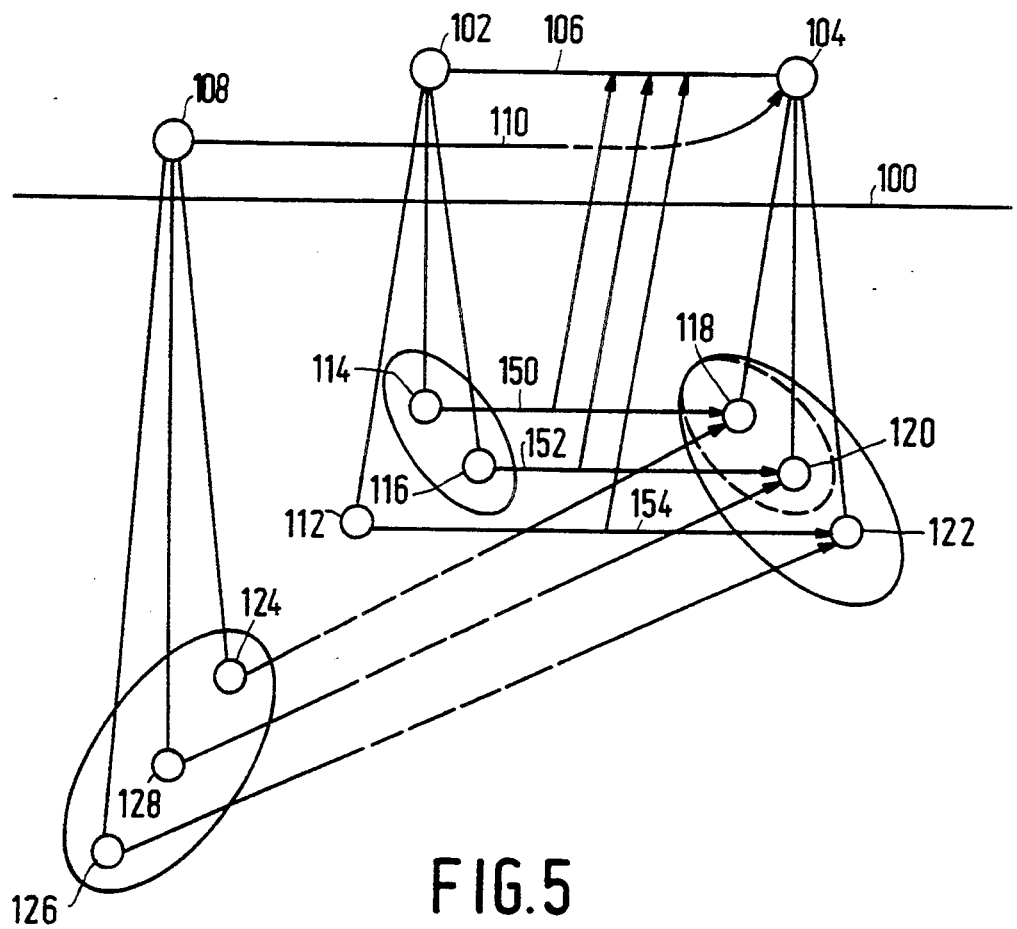
FIGS. 5, 6 represent two accessing mechanisms.
Figure 6:
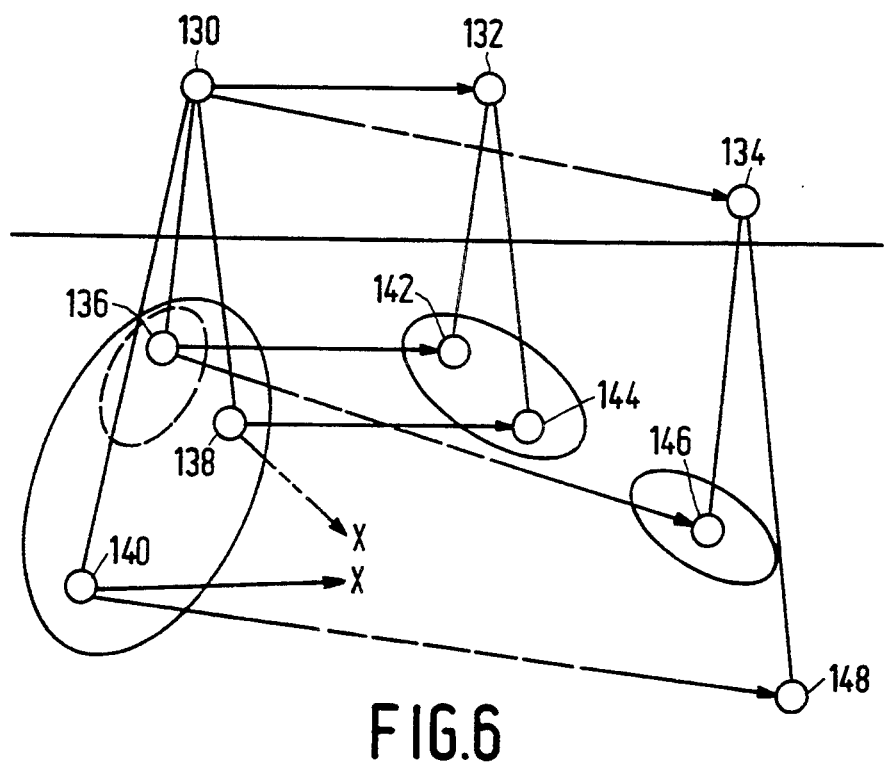

FIGS. 5, 6 illustrate two accessing mechanisms. In FIG. 5, line 100 indicates the dichotomy between flow graph (top) and data graph (bottom). In the flow graph, flow nodes 102, 104 are directly linked by flow link 106. Here flow node 102 is the source and flow node 104 is the destination. Flow node 108 is a further source node to flow node 104 by indirect linkeage which has been shown by interrupted line 110. This latter linkeage may or may not include flow node 102. Flow node 102 is referred to by three data nodes 112, 114, 116. Flow node 104 is referred to by three data nodes 118, 120, 122. Flow node 108 is referred to by data nodes 124, 126, 128. In accessing, a first subset of the data nodes is selected in that they must refer to flow node 104. It is possible to a priori not select all those data nodes, for example in that one or more data nodes contain a directly detectable error. The latter have not been shown. As shown, the data nodes have a linkeage pattern that mimics the linkeage pattern of the flow nodes. Now two arbitrary further subsets of the data nodes are selected, one referring to flow node 108, one to flow node 102. For one reason or another, such as a directly detectable error, data node 112 is excluded from the auxiliary subset related to flow node 102. Now this is used to restrict the first subset of data nodes 118, 120, 122 by excluding data node 122 in that it has not both a directly linked data source node referring to flow node 102 and also a(n indirectly) linked data source node referring to flow node 108. The restriction to the final subset (118, 120) is shown by a broken line. In any more complicated structure, the selecting mechanism would operate in comparable manner; the only differences would be the number of elements in the various sets, the number of terms in the logical AND-function combining the various auxiliary subsets, the depth of the linkeage pattern, and the various reasons leading to exclusion of elements of the respective sets.

Whereas in FIG. 5 the reasoning exploits the upstream linkeage pattern, this is directed in the downstream direction in FIG. 6. Flow node 130 is directly linked as source node to destination flow node 132 and indirectly to destination flow node 134. Again, a part or whole of the indirect path may lead through flow node 132. For selecting, first a subset referring to flow node 130 is selected, to wit, data nodes 136, 138, 140. Flow node 132 is referred to by data nodes 142, 144, both of which are selected in an auxiliary subset. Flow node 134 is referred to by data nodes 146 (selected in its auxiliary subset) and 148 (not selected). In this case the final subset is restricted to data node 136, because of the exclusion of data node 148 (leads to exclusion of data node 140) and the non-existence of two data nodes that would be linked as destination nodes to data source nodes 138, 140. Also in this case, the linkeage pattern may be much more complex. Both selection/restriction organization of FIGS. 5, 6 may combine. The numer of auxiliary subsets may be one on only one side (either upstream or downstream) or two (one upstream and one downstream) or combined.

The database may comprise coupling between links, such as between data links 150, 152, 154, to flow link 106.

We claim:

1. A method for organizing and accessing data stored in a data management system, the data being one of generated by or utilized in a plurality of sub-processes of a single process, comprising the steps of:

generating a first set of flow nodes, each flow node representing a corresponding subprocess;

performing a flow node execution corresponding to the sub-process, wherein a portion of the data is one of utilized by the sub-process or generated by the sub-process;

linking the flow nodes to form a data flow model of the process by connecting a source flow node to a destination flow node to form a first directed-acyclic graph, wherein each flow link represents data generated by execution by the source flow node and required by the destination flow node;

generating a set of data nodes, each data node corresponding to one of the flow nodes for representing one execution of the corresponding flow node and the data generated by the corresponding flow node;

linking said data nodes to form a second directed-acyclic graph by connecting a source data node to a destination data node which represents a portion of the data represented by the source data node for generating data represented by the destination data node;

selecting a first subset of data nodes from the set of data nodes by selecting the data nodes which reference a selected flow node;

selecting a predetermined number of auxiliary subsets of data nodes, each auxiliary subset referencing one further flow node that is one of directly and indirectly linked as a source flow node to the further flow node by a flow link in the first directed-acyclic graph;

generating a final subset of data nodes from the first subset of data nodes by selecting data nodes in the first subset of data nodes for which the corresponding sub-process had utilized data corresponding to one of the data nodes in each of the auxiliary subsets of data nodes; and accessing the data represented by the final subset of data nodes by mapping the data nodes to the data stored in the system.

2. The method of claim 1, further including generating a second predetermined number of auxiliary subsets of data nodes, each second auxiliary subset referencing a second flow node that is linked as a destination flow node to the first flow node by a further flow link in the first directed-acyclic graph; and generating a final subset of data nodes from the first subset of data nodes by selecting data nodes in the first subset of data nodes for which the corresponding sub-process had utilized data corresponding to one of the data nodes in each of the second auxiliary subsets of data nodes.

3. The method of claim 1, wherein each data link is coupled to a flow link and wherein the data represented by the source and destination nodes of each data link corresponds to the sub-process which references the source and destination nodes of the flow link.

4. The method of claim 1, further including the step of generating a further link for interconnecting flow nodes in the first directed-acyclic graph representing additional data corresponding to a destination node of the further link.

5. The method of claim 1, wherein the first directed-acyclic graph forms a hierarchial model of the process by linking nodes representing one of sub-processes and sublinks of interlinked sub-processes.

6. The method of claim 5, further including the step of limiting the access of data generated by execution of the flow nodes to a user having predetermined characteristics.

7. The method of claim 1, further including the step of adding a feedback link to the first directed-acyclic graph to generate a directed graph having at least one cycle.

8. The method of claim 1, wherein the data is electrical engineering data.

9. The method of claim 1, wherein the data is mechanical engineering data.

10. The method of claim 1, wherein the data is software engineering data.

11. The method of claim 1, wherein the data is engineering process data.

* * * * *